(12) United States Patent
Iwase et al.

(10) Patent No.: US 8,050,049 B2
(45) Date of Patent: Nov. 1, 2011

(54) SEMICONDUCTOR DEVICE

(75) Inventors: Teppei Iwase, Hyogo (JP); Kazuhiro Nobori, Osaka (JP); Yoshihiro Tomura, Osaka (JP); Koujiro Nakamura, Osaka (JP); Kentaro Kumazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 254 days.

(21) Appl. No.: 12/427,056

(22) Filed: Apr. 21, 2009

(65) Prior Publication Data

US 2010/0265683 A1    Oct. 21, 2010

(51) Int. Cl.
*H05K 7/00* (2006.01)

(52) U.S. Cl. ........ 361/783; 174/260; 174/262; 174/256; 361/767

(58) Field of Classification Search .................. 361/783, 361/767; 174/260, 262, 256
See application file for complete search history.

(56) References Cited

OTHER PUBLICATIONS

Publication No. 2002-237503 Application No. 2001-031910 Application Date : Aug. 23, 2020.*

* cited by examiner

*Primary Examiner* — Yuriy Semenenko
*Assistant Examiner* — Andargie M Aychillhum
(74) *Attorney, Agent, or Firm* — Steptoe & Johnson LLP (57) ABSTRACT

The present invention provides a semiconductor device of a double-side mounting structure including a circuit board and a plurality of semiconductor chips arranged and joined together on the opposite surfaces of the circuit board, wherein in an area in which the semiconductor chip 31 mounted on the top surface of the circuit board 2 overlaps with the semiconductor chip 32 mounted on the bottom surface of the circuit board 2, a recess portion 21 (or a protruding portion 22) is formed in the surfaces of the circuit board 2.

4 Claims, 7 Drawing Sheets

PRIOR ART

FIG. 11

PRIOR ART

SEMICONDUCTOR DEVICE

FIELD OF THE INVENTION

The present invention relates to a double-side mounting structure for semiconductor chips including a circuit board and a plurality of semiconductor chips arranged and joined together on the opposite surfaces of the circuit board.

BACKGROUND OF THE INVENTION

In a general mounting method, IC chips are sealed in a package made of plastics and so on and mounted on a circuit board. Bare chip mounting has recently been utilized which enables a sharp reduction in mounting area compared to such semiconductor package mounting.

The bare chip mounting, in which IC chips unsealed in a package are mounted on a circuit board, is classified into three types.
(1) Electrodes on the chips are wire-bonded to electrodes on the circuit board.
(2) The electrodes on the chips are connected to the electrodes on the circuit board via a film having leads.
(3) The IC chips are placed face down and connected directly to the circuit board.

The flip chip in (3) is face-down mounting. In this case, a circuit formation surface of each of the semiconductor chips is placed opposite a circuit formation surface of the circuit board. The semiconductor chip is then laid on top of the circuit board via bumps formed of metal such as gold (Au) so as to be electrically continuous with the circuit board. The wire bonding in (1) is face-up mounting. In this case, the circuit formation surface of the circuit board is placed opposite a surface of the semiconductor chip which is located opposite the circuit formation surface thereof. Thin metal wires are then drawn out from the resulting structure by wire bonding. Compared to the face up mounting, the face down mounting enables a size reduction and is commonly utilized.

In recent years, for improved functions, a method described in Japanese Patent Laid-Open No. 2004-23045 or the like has been utilized. That is, even when a double-side mounting structure is adopted which includes a circuit board and semiconductor chips mounted on the opposite surfaces of the circuit board, the bare chips are connected to the circuit board by face-down mounting in order to achieve a size reduction.

DISCLOSURE OF THE INVENTION

Figure 10:
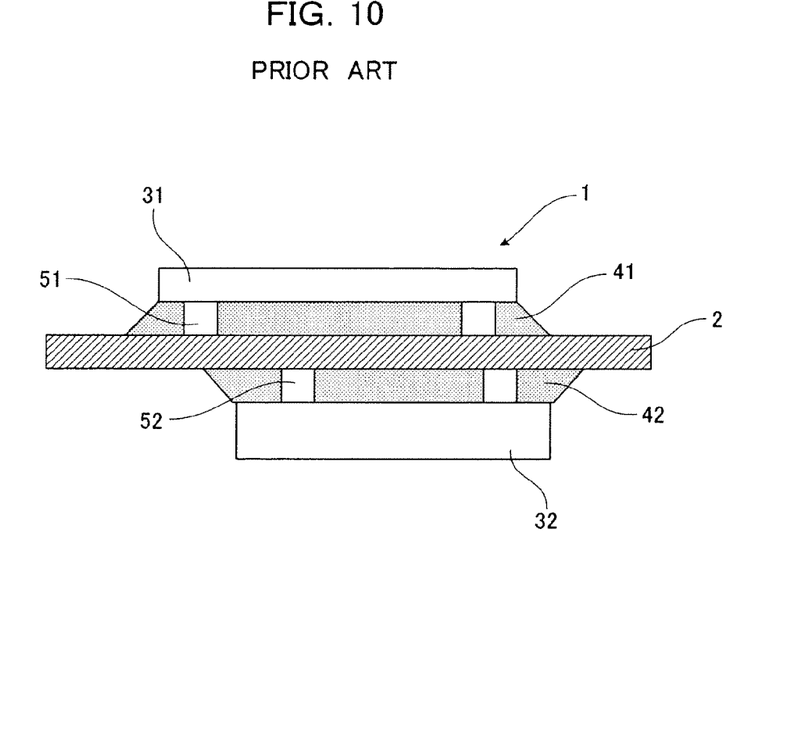
FIG. 10 is a schematic diagram illustrating a general double-side mounting structure for semiconductor chips.

In the double-side mounting structure for semiconductors, the semiconductor chips mounted on the opposite surfaces of the circuit board are not necessarily the same but often vary in chip thickness, size, and the like in order to provide a plurality of functions. Furthermore, when semiconductor chips 31 and 32 are mounted on a circuit board 2 together with passive components so as to make up one module, then according to the arrangement relationship with the passive components, the semiconductor chips 31 and 32 may be misaligned rather than being arranged symmetrically with respect to the circuit board 2 as shown in FIG. 10. Reference numerals 51 and 52 denote bumps. Reference numeral 41 denotes a molding adhesive resin.

Figure 11:
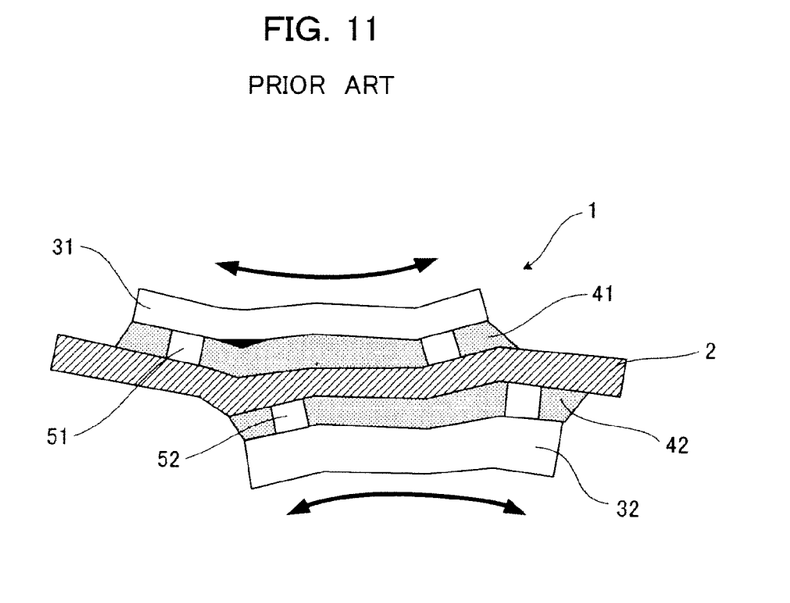
FIG. 11 is a schematic diagram illustrating problems with the double-side mounting structure for semiconductor chips.

In general, the semiconductor chips 31 and 32 have an extremely smaller thermal expansion coefficient than the molding adhesive resin 41, used to join the semiconductor chips 31 and 32 to the circuit board 2, and the circuit board 2 per se. When the semiconductor chips of different sizes are misaligned, a warping tendency over the circuit board 2 differs from that under the circuit board 2. Thus, a heating and cooling treatment during mounting causes a difference in expansion and contraction between the components. This significantly warps the whole circuit board 2 as shown in FIG. 11. The displacement causes the whole circuit board 2 to be undulated. In this case, the semiconductor chip 32 is warped to particularly draw a part of the molding adhesive resin 41 for the semiconductor chip 31 which part is located opposite the outer periphery of the semiconductor chip 32. Then, the circuit formation surface of the semiconductor chip 31 may be peeled off from the molding adhesive resin 41. This may affect the electric performance of the semiconductor device.

The present invention has been made to solve the problems of the conventional art. An object of the present invention is to provide a double-side mounting structure for semiconductor chips including a circuit board and a plurality of semiconductor chips arranged and joined together on the opposite surfaces of the circuit board, the double-side mounting structure reducing loads on the semiconductor chips and a molding resin and allowing a desired structure to be achieved without restrictions on the arrangement of the semiconductor chips.

The present invention provides a semiconductor device of a double-side mounting structure including a circuit board and semiconductor chips mounted respectively on a top surface and a bottom surface of the circuit board, wherein in an area in which the semiconductor chip mounted on the top surface of the circuit board overlaps with the semiconductor chip mounted on the bottom surface of the circuit board, a recess portion is formed in at least one of the surfaces of the circuit board.

Furthermore, the recess portion formed in the surface of the circuit board is shaped like a key along a position corresponding to the outer periphery of the semiconductor chip mounted on the opposite side of the circuit board.

The present invention provides a semiconductor device of a double-side mounting structure including a circuit board and semiconductor chips mounted respectively on a top surface and a bottom surface of the circuit board, wherein in an area in which the semiconductor chip mounted on the top surface of the circuit board overlaps with the semiconductor chip mounted on the bottom surface of the circuit board, a protruding portion is formed on at least one of the surfaces of the circuit board.

Furthermore, the protruding portion formed on the surface of the circuit board is shaped like a key along a position corresponding to the outer periphery of the semiconductor chip mounted on the opposite side of the circuit board.

The present invention provides a semiconductor device of a double-side mounting structure including a circuit board and semiconductor chips mounted respectively on a top surface and a bottom surface of the circuit board, wherein in an area in which the semiconductor chip mounted on the top surface of the circuit board does not overlap with the semiconductor chip mounted on the bottom surface of the circuit board, an elastic body is formed on the surfaces of the circuit board.

This configuration enables reductions in possible local undulation resulting from the misalignment of semiconductor chips of different sizes and in a tensile force exerted on a molding adhesive resin as a result of the undulation, thereby avoiding a peel-off phenomenon that may occur between the semiconductor chip and the molding adhesive resin.

DESCRIPTION OF THE EMBODIMENTS

The present invention will be described with reference to FIGS. 1A and 1B to 9 showing embodiments of the present invention. Components exerting similar effects are denoted by the same reference numeral.

Embodiment 1

Figure 1A:
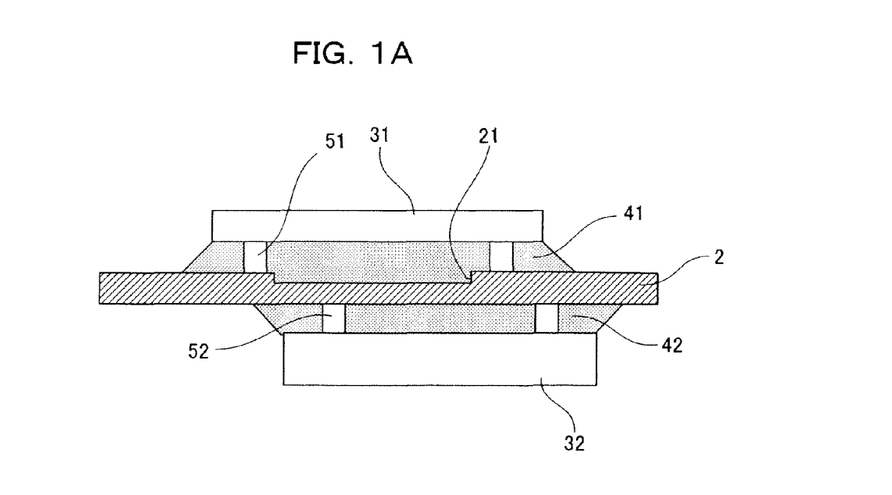
FIG. 1A is a sectional view of a semiconductor device according to Embodiment 1 of the present invention.
Figure 1B:
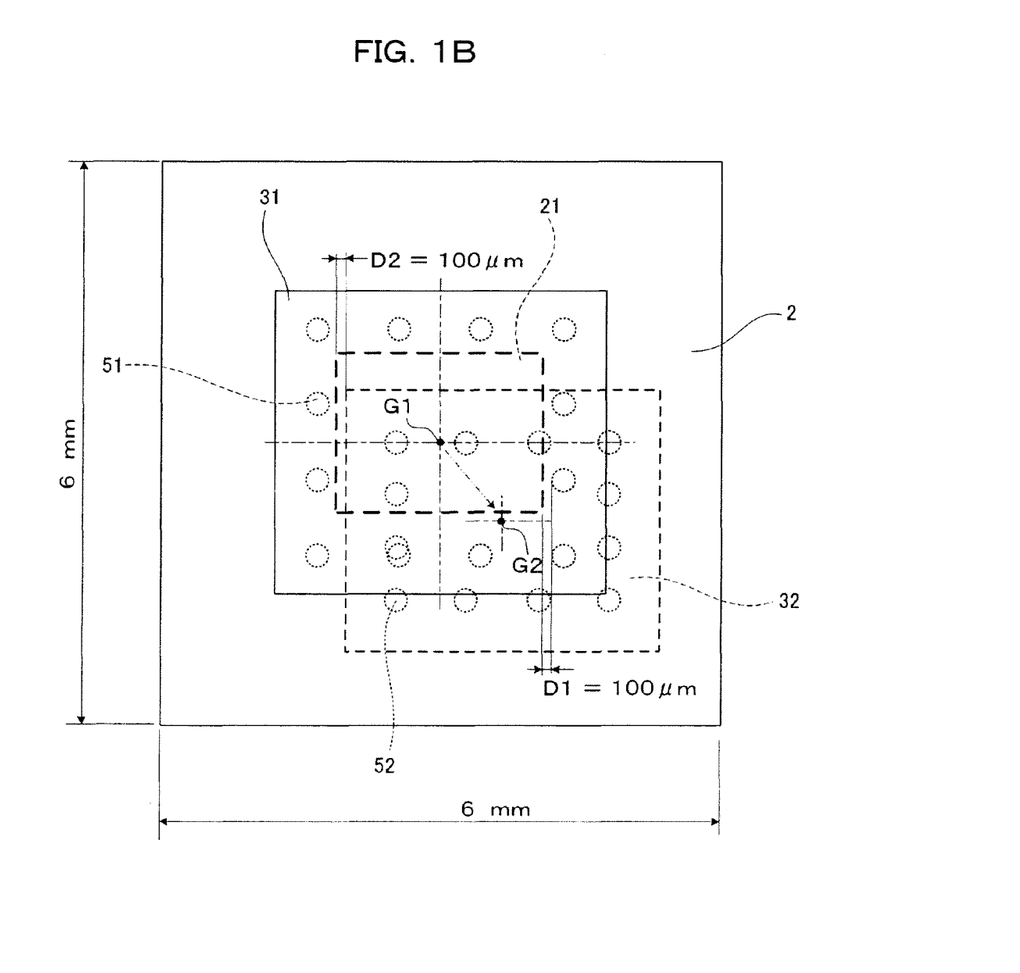
FIG. 1B is a plan view of the semiconductor device according to Embodiment 1 of the present invention.

FIGS. 1A and 1B show Embodiment 1 of the present invention.

A semiconductor chip 31 is flip-flop mounted face-down on the top surface of a circuit board 2. A semiconductor chip 32 is flip-flop mounted face-down on the bottom surface of the circuit board 2.

Specifically, a molding adhesive resin 41 is formed on the top surface of the circuit board 2. The semiconductor chip 31 is mounted on the molding adhesive resin 41. The semiconductor chip 31 is externally shaped to have, in this case, a length of 3 mm, a width of 3 mm, and a thickness of 200 μm, which are an example of dimensions in a system LSI.

The circuit board 2 is externally shaped to have a length of 6 mm, a width of 6 mm, and a thickness of 300 μm. The circuit board 2 is a double-side circuit board with a 6-layer configuration. Although not shown in detail, electrodes on the surface of the circuit board 2 are electrically joined to pads on the surface of the semiconductor chip 31 via bumps 51. The bumps 51 are about 20 μm in height and about 50 μm in diameter. The electrodes on the surface of the circuit board 2 are about 20 μm in height. Thus, the molding adhesive resin 41, interposed between the circuit board 2 and the semiconductor chip 31, has a total height of about 40 μm.

A conductive adhesive resin with a metal filler mixed therein or an insulating adhesive resin is used as the molding adhesive resin 41. The molding adhesive resin 41 forms a fillet in a peripheral portion of the semiconductor chip 31.

Each of the bumps 51 is formed of a metal such as solder and gold, a conductive resin ball, a combination of them, and the like. The bump 51 is formed such that the center thereof lies about 150 μm inward of the corresponding edge of the semiconductor chip 31.

The aforementioned structure is formed by sticking the molding adhesive resin 41 in sheet form onto the circuit board 2, then mounting the semiconductor chip 31 on the molding adhesive resin 41, and applying pressure and heat on the top surface of the semiconductor chip 31. Alternatively, the structure is formed by joining the semiconductor chip 31 to the circuit board 2 using only the bumps 51 and then injecting the molding adhesive resin 41 in paste form through the bumps 51 for adhesion.

A molding adhesive resin 42 is similarly formed on the bottom surface of the circuit board 2. The semiconductor chip 32 is mounted on the molding adhesive resin 42. The semiconductor chip 32 is electrically joined to the circuit board 2 via bumps 52. The external size of the semiconductor chip 32 is similar to that of the semiconductor chip 31. The junction method for the semiconductor chip 32, the shape of the bumps, and the like are also similar to those on the semiconductor chip 31 side.

As shown in FIG. 1B, the semiconductor chips 31 and 32 are not symmetrically arranged as viewed from above. The semiconductor chips 31 and 32 are arranged such that the center of gravity G2 of the semiconductor chip 32 is displaced from the center of gravity G1 of the semiconductor chip 31 by 1 mm in the vertical direction and by 1 mm in the horizontal direction.

In the top surface of the circuit board 2, on which the semiconductor chip 31 is mounted, a recess portion 21 is formed in an area in which the semiconductor chips 31 and 32 overlap as shown in FIGS. 1A and 1B.

The recess portion 21 is about 30 μm in depth. The molding adhesive resin 41 is also injected into the recess portion 21. The height of the molding adhesive resin 41, that is, the distance from the semiconductor chip 31 to the circuit board 2, is largest, that is, 70 μm, in the recess portion 21. The recess portion 21, provided in the circuit board 2, is formed by performing a processing treatment such as etching on the surface of the circuit board 2 during the manufacture of the circuit board 2.

An example of the detailed dimensions of the area in which the recess portion 21 is formed is shown below.

The recess portion 21 is formed in the entire area in which the semiconductor chips 32 and 31 overlap. However, the area is limited according to restrictions on the arrangement of the bumps 51 formed on the semiconductor chip 31.

The plan position of the recess portion 21 is arranged such that as shown in FIG. 1B, the recess portion 21 is present at least D1=100 μm inward of the bumps 51 formed on the semiconductor chip 31, in order to ensure a required area around the periphery of the bumps 51 into which the molding adhesive resin is injected.

Furthermore, a tensile force exerted on the molding adhesive resin 41 on the semiconductor chip 31 side as a result of the warpage of the semiconductor chip 32 side may be maximum outside the edge of the semiconductor chip 32. Thus, the recess portion 21 is preferably formed so as to extend to an area outside the corresponding edge of the semiconductor chip 32. In this case, the recess portion 21 is formed to extend beyond from the edge by at least D2=100 μm.

Thus, the molding adhesive resin 41 between the recess portion 21 and the semiconductor chip 31 is formed to be high. Consequently, the molding adhesive resin 41 with a certain height mitigates the adverse effect of undulation of a part of the circuit board 2 which corresponds to the outer peripheral portion of the semiconductor chip 32, the undulation resulting from the warpage of the semiconductor chip 32 mounted on the circuit board 2 opposite the semiconductor chip 31. This enables a reduction in a tensile force exerted on the interface between the part of the semiconductor chip 31 and the molding adhesive resin 41.

Embodiment 2

Figure 2:
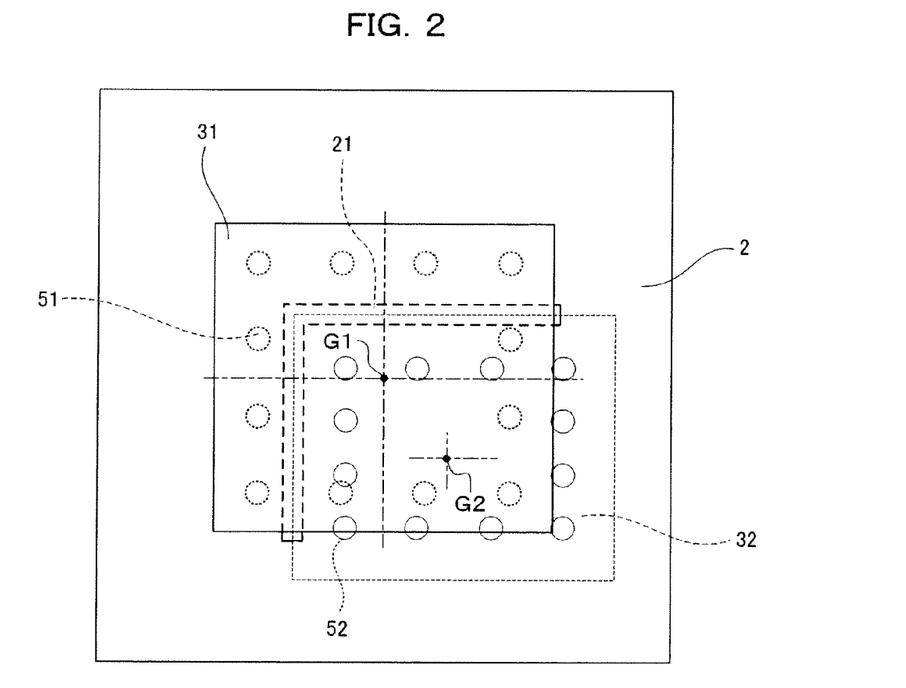
FIG. 2 is a plan view of a semiconductor device according to Embodiment 2 of the present invention.
Figure 3:
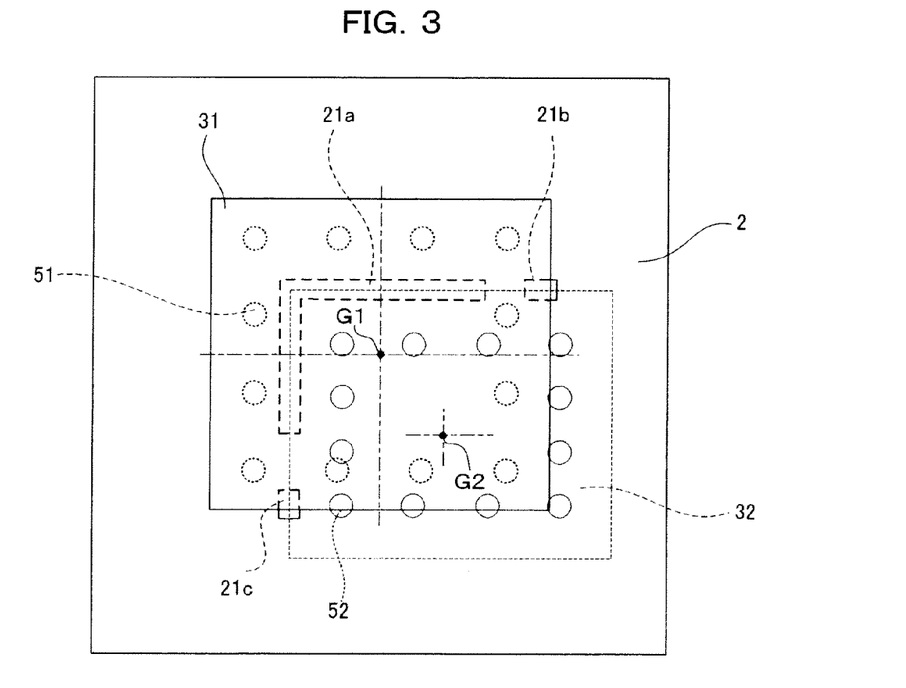
FIG. 3 is another plan view of the semiconductor device according to Embodiment 2 of the present invention.

FIGS. 2 and 3 show Embodiment 2 of the present invention.

In Embodiment 1, the entire recess portion 21 formed on the top surface of the circuit board 2 is formed in the area in which the semiconductor chips 31 and 32 overlap. However, if it is difficult to form this owing to restrictions on electric wiring on a circuit board 2, then as shown in FIG. 2, a recess portion 21 may be formed restrictively in a key-shaped area along a position corresponding to the outer periphery of a semiconductor chip 32, where a tensile force reaches the maximum. This structure exerts effects similar to those of Embodiment 1. In this case, the width of the key-shaped recess portion 21 is at least 200 μm in total, that is, the sum of at least 100 μm outside the semiconductor chip 32 and at least 100 μm inside the semiconductor chip 32.

Furthermore, the square recess portion 21 shown in FIGS. 1A and 1B or the recess portion 21 located in the key-shaped area as shown in FIG. 2 is formed continuously in a semiconductor chip 31. However, in actuality, besides bumps 51, a copper pattern other than electrodes is often formed inside the semiconductor chip 31 on the surface of the circuit board 2. Thus, the recess portion 21 cannot always be continuously formed. If such a pattern makes the formation of the recess portion 21 difficult, then for example, as shown in FIG. 3, a discontinuous recess portion 21 including recess portions 21a, 21b, and 21c may be formed depending on the layout of the bumps 51 formed on the semiconductor chip 31 or other restrictions.

In Embodiments 1 and 2, for simplification of description, the recess portions 21, 21a, 21b, and 21c are formed only in the surface of the circuit board 2 located opposite the semiconductor chip 31. However, in connection with possible undulation, each of the semiconductor chips exerts similar adverse effects on the other semiconductor chip. Thus, the recess portions 21, 21a, 21b, and 21c may be formed only in the surface of the circuit board 2 located opposite the semiconductor chip 32 or both in the surface of the circuit board 2 located opposite the semiconductor chip 31 and in the surface of the circuit board 2 located opposite the semiconductor chip 32, in the same manner.

Embodiment 3

Figure 4A:
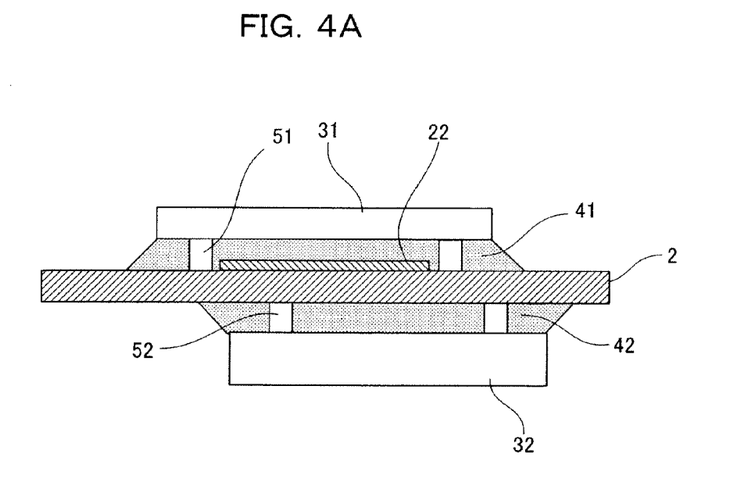
FIG. 4A is a sectional view of a semiconductor device according to Embodiment 3 of the present invention.
Figure 4B:
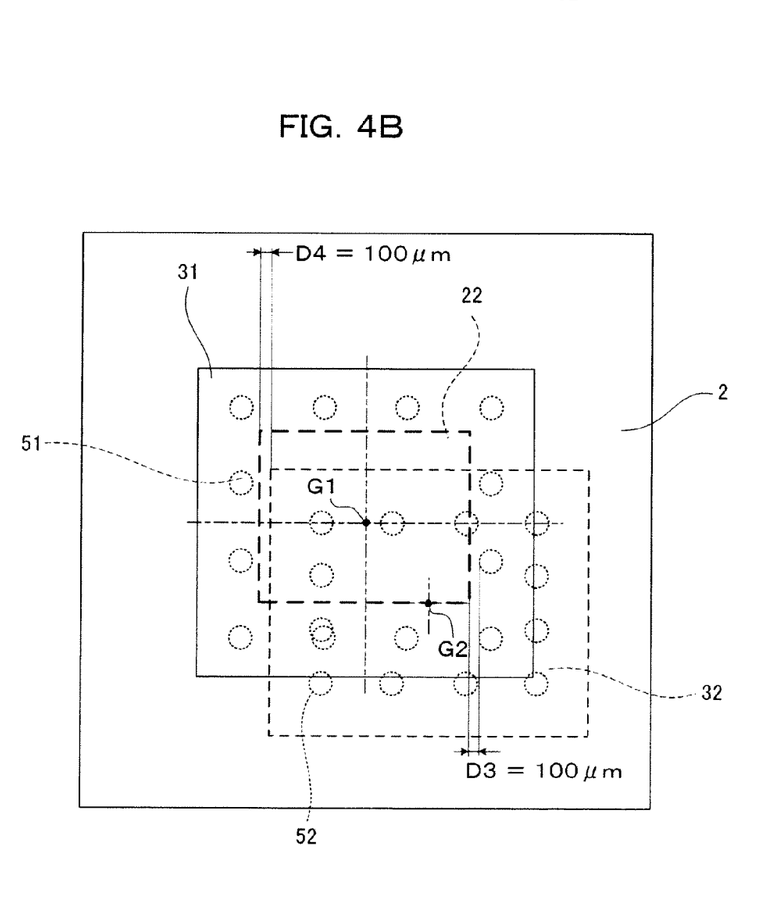
FIG. 4B is a plan view of the semiconductor device according to Embodiment 3 of the present invention.

FIGS. 4A and 4B show Embodiment 3 of the present invention.

In Embodiment 3, as shown in FIGS. 4A and 4B, a protruding portion 22 is formed on a surface of a circuit board 2 on which a semiconductor chip 31 is mounted. The protruding portion 22 is about 30 μm in height.

The protruding portion 22 is composed of any material such as an epoxy resin containing glass cloth with a larger elastic modulus than a molding adhesive resin. Specifically, the molding adhesive resin has an elastic modulus of about 5 GPa. The epoxy resin containing glass cloth has an elastic modulus of at least 10 GPa.

Such a hard material is formed on the circuit board 2 to locally increase the thickness of the circuit board in the area containing the material. This prevents the semiconductor chip 31 from being affected by the warpage of a semiconductor chip 32 mounted on the opposite side of the circuit board 2. Thus, a possible tensile force exerted on the interface between the semiconductor chip 31 and a molding adhesive resin 41 can be reduced.

An example of the detailed dimensions of the area in which the protruding portion 22 is formed is shown below.

The protruding portion 22 is formed in the entire area in which the semiconductor chips 32 and 31 overlap. However, the area is limited according to restrictions on the arrangement of bumps 51 formed on the semiconductor chip 31. For example, in FIG. 4B, the external shape of a planar area of the protruding portion 22 is assumed such that the protruding portion 22 is present at least 100 μm inward of the bumps 51 formed on the semiconductor chip 31, as shown at D3 in FIG. 4B, in order to ensure a required area around the periphery of the bumps 51 into which a molding adhesive resin is injected. Furthermore, a tensile force exerted on the molding adhesive resin 41 on the semiconductor chip 31 side as a result of the warpage of the semiconductor chip 32 side may be maximum outside the edge of the semiconductor chip 32. Thus, as shown at D4 in FIG. 4B, the protruding portion 22 is preferably formed so as to extend to an area outside the corresponding edge of the semiconductor chip 32. In this case, the protruding portion 22 is formed to extend beyond from the semiconductor chip 32 by at least 100 μm.

Embodiment 4

Figure 5:
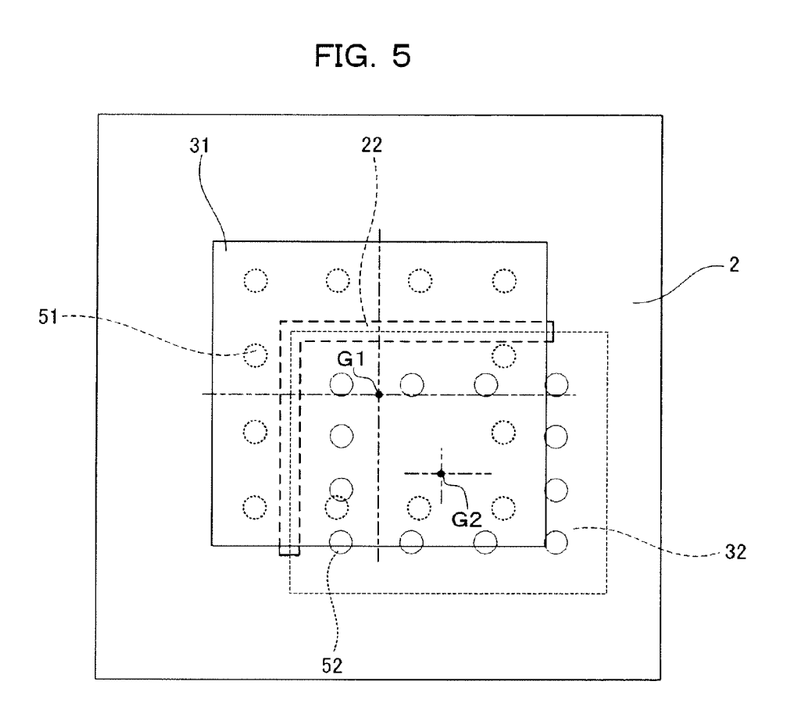
FIG. 5 is a plan view of a semiconductor device according to Embodiment 4 of the present invention.
Figure 6:
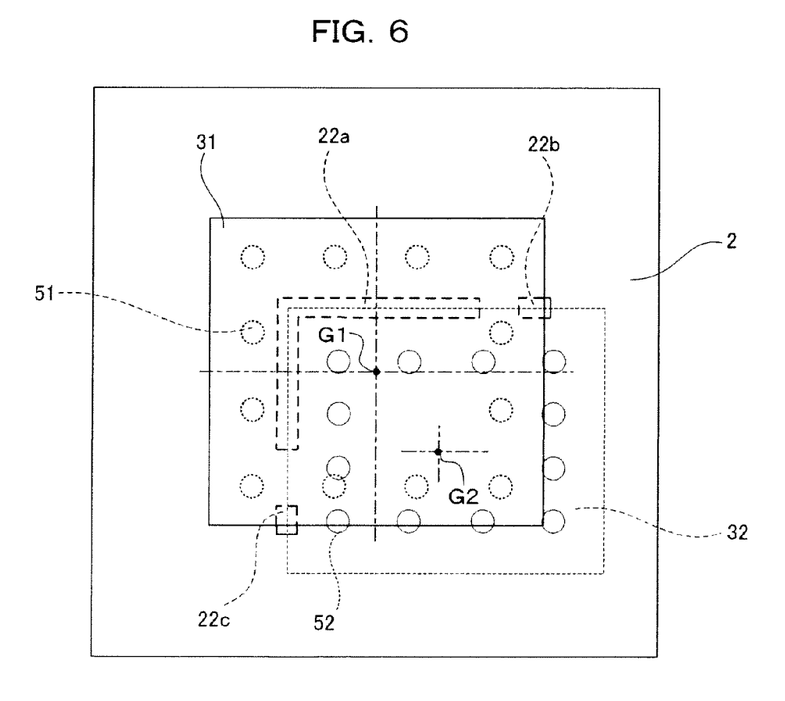
FIG. 6 is another plan view of the semiconductor device according to Embodiment 4 of the present invention.

FIGS. 5 and 6 show Embodiment 4 of the present invention.

In Embodiment 3, the entire protruding portion 22 formed on the top surface of the circuit board 2 is formed in the area in which the semiconductor chips 31 and 32 overlap. However, in Embodiment 4, as shown in FIG. 5, a protruding portion 22 may be formed restrictively in a key-shaped area along a position corresponding to the outer periphery of a semiconductor chip 32, where a tensile force reaches the maximum. This structure exerts effects similar to those of Embodiment 3. In this case, the width of the key-shaped protruding portion 22 is at least 200 μm in total, that is, the sum of at least 100 μm outside the semiconductor chip 32 and at least 100 μm inside the semiconductor chip 32.

Furthermore, the square protruding portion 22 or the protruding portion 22 located in the key-shaped area is formed continuously in a semiconductor chip 31. However, in actuality, besides bumps 51, a copper pattern other than electrodes is often formed in the semiconductor chip 31, on the surface of a circuit board 2. Thus, the protruding portion 22 cannot always be continuously formed. If such a pattern makes the formation of the protruding portion 22 difficult, then for example, as shown in FIG. 6, a discontinuous protruding portion 22 including protruding portions 22a, 22b, and 22c may be formed depending on the layout of the bumps 51 formed on the semiconductor chip 31 or other restrictions.

Alternatively, the protruding portions 22, 22a, 22b, and 22c according to Embodiments 3 and 4 may be formed using a metal material such as copper. In this case, effects different from the aforementioned effects are exerted. Specifically, in general, an epoxy resin does not adhere well to the metal material, so that a molding adhesive resin 41 and the protruding portion 22 are easily separated from each other under an external load. Thus, the warpage of the side on which the semiconductor chip 32 is mounted is utilized to pre-separate the molding adhesive resin 41 from the protruding portion 22. This is expected to avoid a tensile force exerted on the interface between the molding adhesive resin 41 and the semiconductor chip 31. In this case, the releasability of the semiconductor chip 31 from the molding adhesive resin 41 can be effectively improved by applying a fluorine- or silicon-containing releasing agent to or performing a releasing treatment with an organic thin film or the like on the outermost surface of the protruding portion 22.

Furthermore, in Embodiments 3 and 4, for simplification of description, the protruding portions 22, 22a, 22b, and 22c are formed only on the surface of the circuit board 2 located opposite the semiconductor chip 31. However, in connection with possible undulation, each of the semiconductor chips exerts similar adverse effects on the other semiconductor chip. Thus, the protruding portions 22, 22a, 22b, and 22c may be formed only on the surface of the circuit board 2 located opposite the semiconductor chip 32 or both on the surface of the circuit board 2 located opposite the semiconductor chip 31 and on the surface of the circuit board 2 located opposite the semiconductor chip 32, in the same manner.

Embodiment 5

FIGS. 7A and 7B to 9 show Embodiment 5.

Figure 7A:
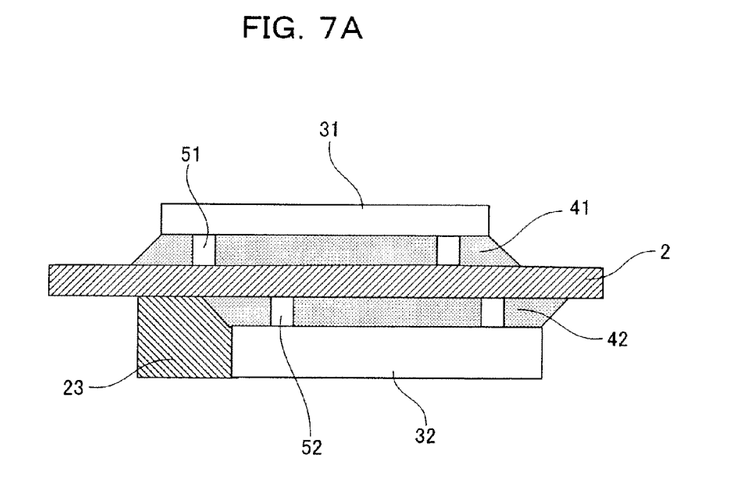
FIG. 7A is a sectional view of a semiconductor device according to Embodiment 5 of the present invention.
Figure 7B:
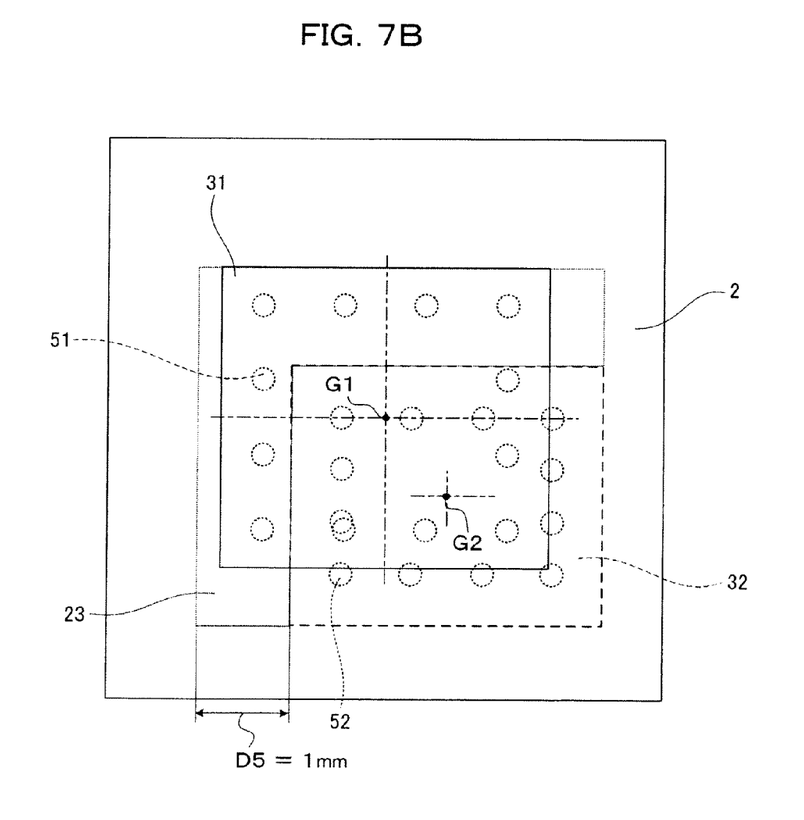
FIG. 7B is a plan view of the semiconductor device according to Embodiment 5 of the present invention.
Figure 8:
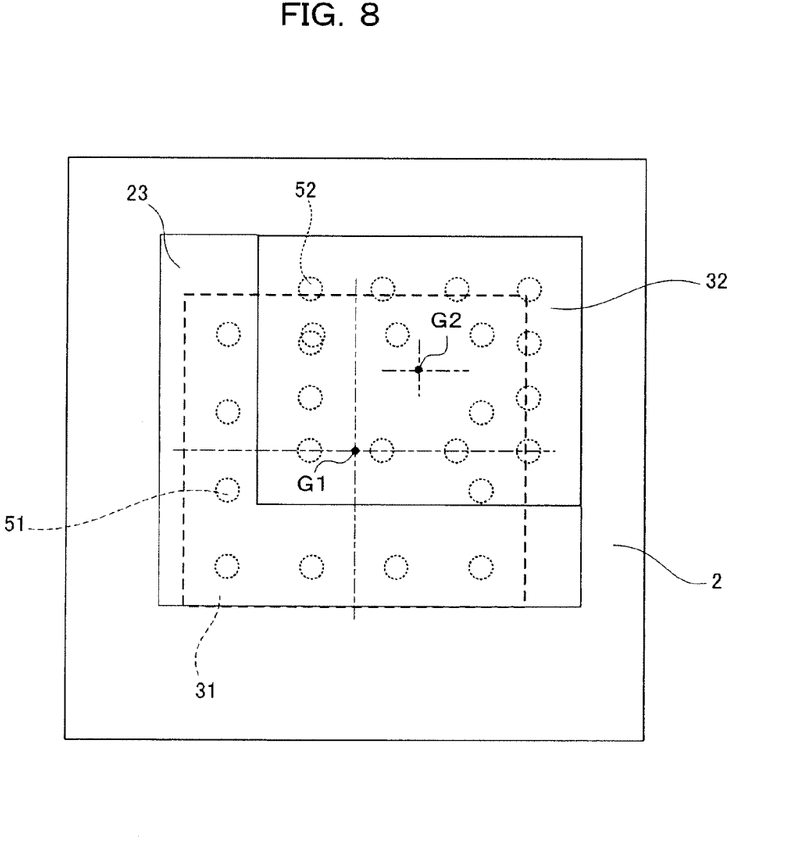
FIG. 8 is a rear view of Embodiment 5.
Figure 9:
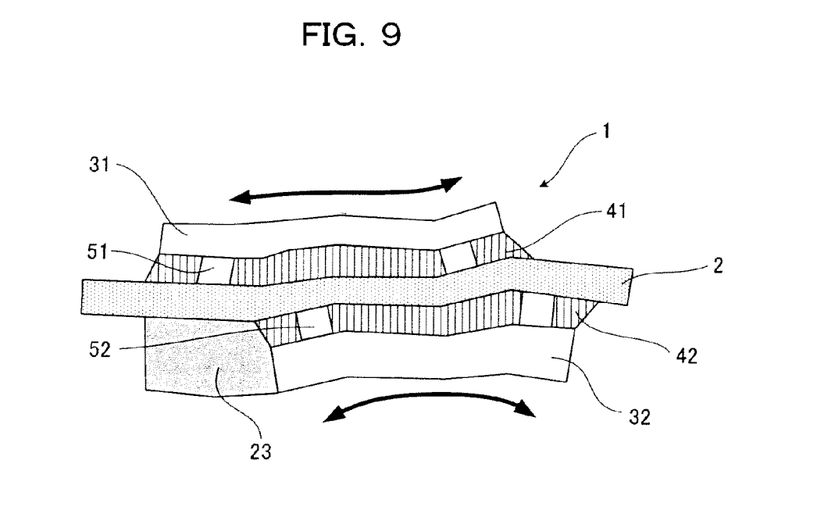
FIG. 9 is a schematic view showing the application effects of Embodiment 5.

In Embodiment 5, as shown in FIGS. 7A and 7B, in a part of an area where a semiconductor chip 31 is mounted on a circuit board 2, in which part the semiconductor chip 31 does not overlap with a semiconductor chip 32 on the opposite side, an elastic body 23 is formed on a surface of the circuit board 2 on which the semiconductor chip 32 is mounted. FIG. 8 is a rear view of FIG. 7B showing that the elastic body 23 is shaped like a key along the outer periphery of the semiconductor chip 32.

The elastic body 23 formed like a key so as to cover a side surface of the semiconductor chip 32, is made of a material having a smaller coefficient of linear expansion or a larger elastic modulus than the base material of the circuit board 2. Specifically, the elastic body 23 has a coefficient of linear expansion of 20 ppm/° C. and an elastic modulus of 8 GPa. A typical example of such a material is an epoxy resin, which generally has a high filler concentration. Forming such an elastic body in the appropriate area allows the elastic body 23 to inhibit the possible undulation of the whole circuit board 2 as shown in FIG. 8. This prevents the molding adhesive resin on the semiconductor chip from being drawn due to the undulation.

The specific dimensions of the area in which the elastic body 23 is located are shown below.

To maximize the effects of the elastic body 23, the elastic body 23 is located all over the area in which the semiconductor chips 31 and 32 do not overlap. The semiconductor chips 31 and 32 are misaligned by 1 mm in the vertical direction and by 1 mm in the horizontal direction as previously described. Thus, the elastic body 23 is formed on the side surface of the semiconductor chip 32 so as to have a width of about 1 mm from the edge of the semiconductor chip 32, as shown by reference numeral D5 in FIG. 7B. The height of the elastic body 23 is equal to the sum of the height of a molding adhesive resin 42, 40 µm, and the thickness of the semiconductor chip 32, 200 µm, that is, about 240 µm.

In the aforementioned embodiment, the elastic body 23 may be discontinuously located according to restrictions on the arrangement of other passive components present around the periphery of the semiconductor chip. Furthermore, the elastic body 23 is at the level of the top surface of the semiconductor chip 32. However, the height may be reduced depending on the required amount.

For simplification of description, the elastic body 23 is formed only on the surface of the circuit board 2 on which the semiconductor chip 32 is mounted. However, in connection with possible undulation, each of the semiconductor chips exerts similar adverse effects on the other semiconductor chip. Thus, the elastic body 23 may be formed similarly on the surface of the circuit board 2 on which the semiconductor chip 31 is mounted.

The double-side mounting structure for semiconductor chips according to the present invention allows for reductions in possible local undulation resulting from the misalignment of the semiconductor chips of different sizes and in a tensile force exerted on the molding adhesive resin as a result of the undulation. A peel-off phenomenon that may occur between the semiconductor chip and the molding adhesive resin can thus be avoided. Furthermore, the thicknesses of the circuit board and the semiconductor chip can further be reduced, enabling a reduction in the size and thickness of the semiconductor mounting structure.

What is claimed is:

1. A semiconductor device comprising;
    a first semiconductor chip mounted by a layer of a first resin on a top surface of a circuit board; and
    a second semiconductor chip mounted by a layer of said first resin on a bottom surface of the circuit board, the center of gravity of the second semiconductor chip being positioned away from the center of gravity of the first semiconductor chip as viewed from above,
    wherein in an area in which the first semiconductor chip overlaps with the second semiconductor chip as viewed from above, there is in a recessed portion in at least one of the surfaces of the circuit board or a protruding portion of a resin material having an elastic modulus greater than that of said first resin on at least one of the surfaces of the circuit board.

2. The semiconductor device according to claim 1, wherein the recess portion formed in or the protruding portion of resin material formed on the surface of the circuit board is in a key-shape along a position corresponding to an outer periphery of the semiconductor chip mounted on the opposite side of the circuit board.

3. The semiconductor device according to claim 1, wherein the recessed portion intermittently formed in or the protruding portion of resin material intermittently formed on the surface of the circuit board is in a key-shape along a position corresponding to an outer periphery of the semiconductor chip mounted on the opposite side of the circuit board.

4. A semiconductor device comprising:
    a first semiconductor chip mounted by a layer of a first resin on a top surface of a circuit board; and
    a second semiconductor chip mounted by a layer of said first resin on a bottom surface of the circuit board, the center of gravity of the second semiconductor chip being positioned away from the center of gravity of the first semiconductor chip as viewed from above,
    wherein in an area in which the first semiconductor chip does not overlap with the second semiconductor chip as viewed from above, there is in a recessed portion in at least one of the surfaces of the circuit board or a protruding portion of a resin material having an additional elastomeric resin is formed on the surfaces of the circuit board.

* * * * *